United States Patent [19]

Dorman et al.

[11] Patent Number: 5,001,494
[45] Date of Patent: Mar. 19, 1991

[54] COMPACT ANTENNA RANGE

[75] Inventors: Gerald C. Dorman, Lindenhurst; Joseph Ranghelli, Brooklyn, both of N.Y.

[73] Assignee: Raytheon Company, Lexington, Mass.

[21] Appl. No.: 367,811

[22] Filed: Jun. 19, 1989

[51] Int. Cl.⁵ .......................................... G01R 29/08
[52] U.S. Cl. .............................................. 343/703
[58] Field of Search .................... 343/703; 174/35 MS

[56] References Cited

U.S. PATENT DOCUMENTS

| 3,806,943 | 4/1974 | Holloway | 343/703 |
| 4,218,683 | 8/1980 | Hemming | 343/703 |
| 4,387,467 | 6/1983 | Kirby | 343/703 |
| 4,837,581 | 6/1989 | Hansen et al. | 343/703 |

FOREIGN PATENT DOCUMENTS 3722406 10/1988 Fed. Rep. of Germany ...... 343/703

OTHER PUBLICATIONS

Keen, K. M., Simulation of a Proposed Near-Field-to-Far-Field Antenna Measurement System, Electronics Letters, vol. 13, No. 8, Apr. 1977.

Primary Examiner—Rolf Hille
Assistant Examiner—Peter Toby Brown
Attorney, Agent, or Firm—Donald F. Mofford; Richard M. Sharkansky

[57] ABSTRACT

A miniature anechoic changer for testing antennas capable of producing radio frequency energy with a planar wavefront substantially uniform and free of distortion is shown. The chamber is comprised of a source antenna located in the near field of the test antenna radiating radio frequency energy having a wavefront with an amplitude having a distribution pattern that approximates (SIN X)/X and a lens having a focal point mounted such that the focal point of the lens is located in the center of the source antenna. As the source antenna radiates energy the energy passing through the lens is converted from a spherical wavefront to a planar wavefront substantially uniform and free of distortion.

6 Claims, 3 Drawing Sheets

COMPACT ANTENNA RANGE

BACKGROUND OF THE INVENTION

This invention pertains generally to compact antenna ranges, and more particularly to an improved anechoic chamber in which radiation patterns may be measured using radio frequency (R.F.) energy having substantially uniform and free of distortion wavefronts.

It is known in the art that anechoic chambers are used to determine the antenna pattern of a test antenna. The test antenna, mounted on a test antenna mounting surface on the anechoic chamber, is illuminated by a test signal comprised of R.F. energy from a source antenna located in the anechoic chamber. The R.F. energy produced by the source antenna has a wavefront having near-field characteristics, meaning a wavefront not having uniform amplitude and phase. The area illuminating the aperture of the test antenna, also known as a "quiet zone," typically is illuminated by the near-field wavefront. A resultant antenna pattern of the test antenna may not be accurate due to the lack of uniform amplitude and phase of the energy in the quiet zone. Various techniques have been attempted without success to create a wavefront in the quiet zone having far-field characteristics, meaning a wavefront having uniform amplitude and phase.

Another deficiency of any known type of anechoic chamber is that a design useful for any given frequency of R.F. energy is probably not useful at a different frequency. That is to say, known types of anechoic chambers are narrow band devices. Further, it is not possible for adapt any known anechoic chamber to use at a frequency other than its design frequency simply by scaling dimensions.

SUMMARY OF THE INVENTION

With the foregoing background of this invention in mind, it is a primary object of this invention to provide an anechoic chamber that accurately simulates far-field conditions.

Another object of this invention is to provide, in an anechoic chamber for testing antennas, a beam of R.F. energy wherein the amplitude and phase distortion of the wavefronts of such energy is negligible in a portion of such beam illuminating a test antenna.

A further object of this invention is to provide, in an anechoic chamber for testing antennas, a steerable beam of R.F. energy for illuminating a test antenna with collimated R.F. energy originating at different places.

The foregoing and other objects of this invention are attained generally by providing, in an anechoic chamber for testing antennas, (a) a radio frequency energy source producing a beam of R.F. energy substantially the same as a beam of R.F. energy with a (SIN X)/X amplitude distribution; (b) a reflector having a concave reflecting surface; and (c) a plano-convex dielectric lens for collimating R.F. energy irradiating an antenna to be tested, with elements (a) and (c) being rotatable as a unit with respect to the antenna to be tested to change the angle of incidence of the collimated R.F. energy on the aperture of the antenna to be tested.

BRIEF DESCRIPTION OF THE DRAWINGS

For a more complete understanding of this invention, reference is now made to the following description of the accompanying drawings, wherein.

DESCRIPTION OF THE PREFERRED EMBODIMENT

Figure 1:
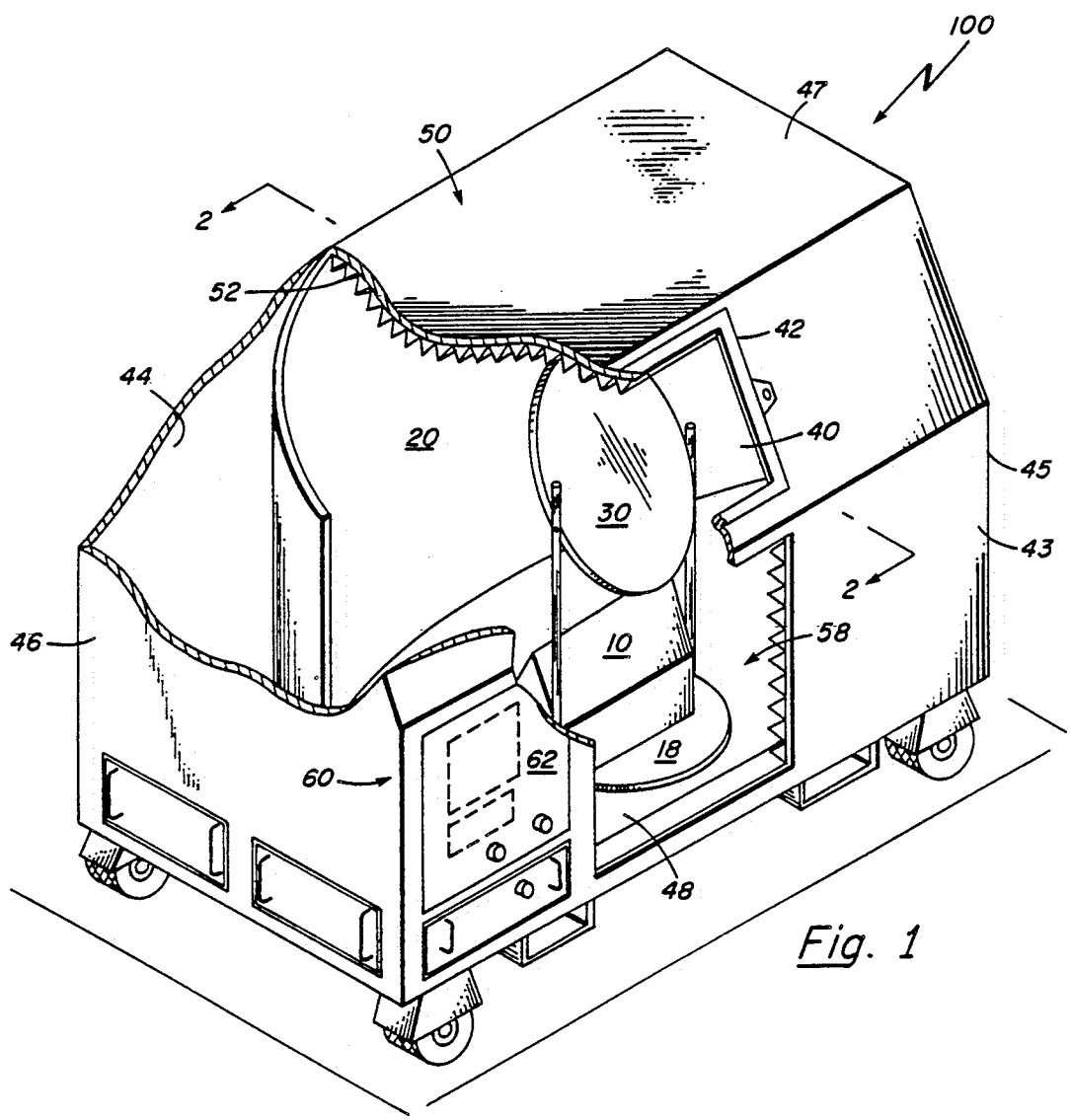
FIG. 1 illustrates an isometric view, partially cut away for clarity of illustration, of an anechoic chamber according to this invention.
Figure 2:
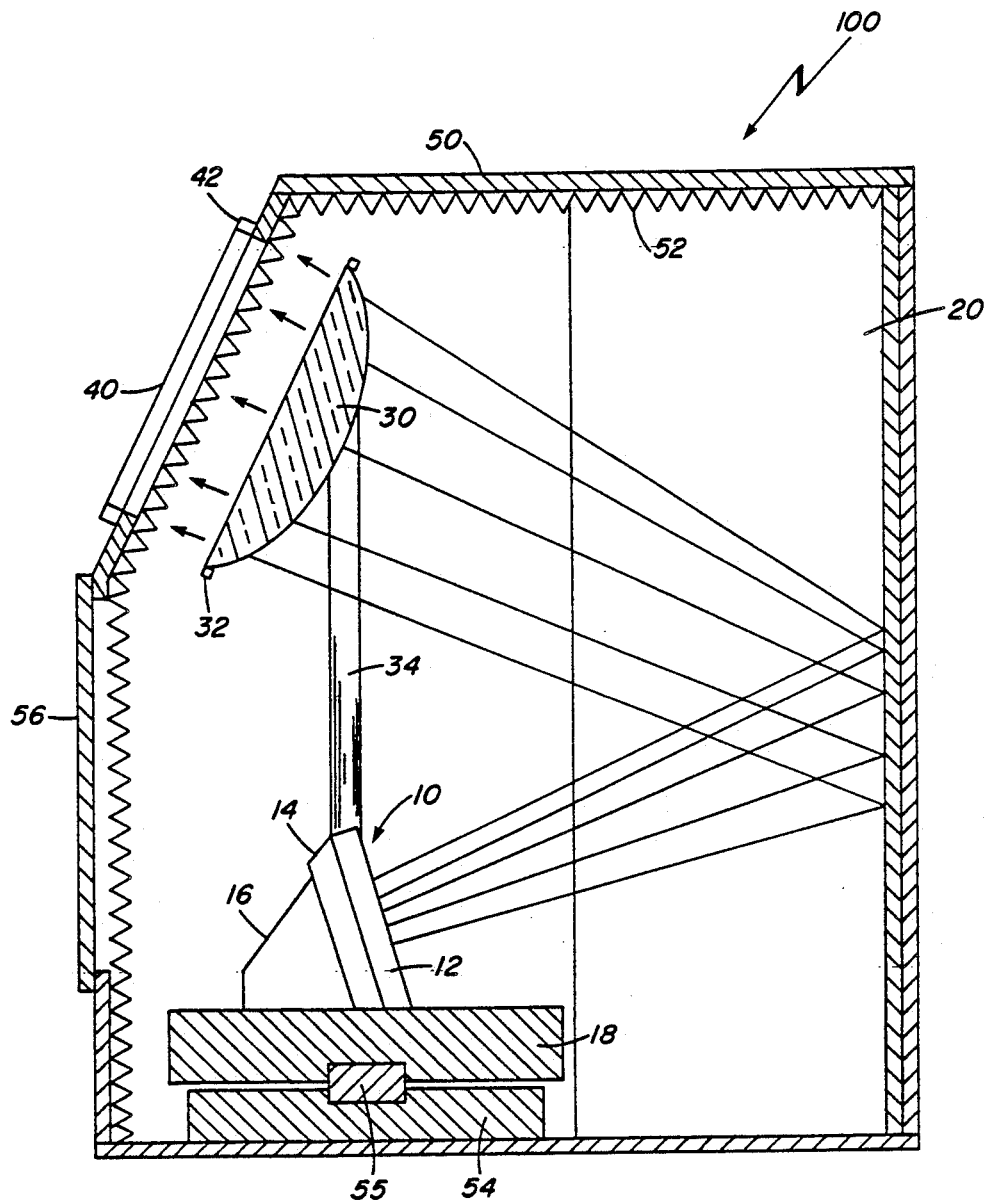
FIG. 2 is a cross-sectional view taken along the center of FIG. 1.

Referring now to FIG. 1, there is shown a preferred embodiment of a anechoic chamber 100 according to this invention. An enclosure 50 (having a front wall 43, a rear wall 44, a right side wall 45, a left side wall 46, a top wall 47 and a bottom wall 48) is constructed in any known manner to define the enclosure 50. Mounted on each of the four corners underneath the bottom wall 48 of the enclosure 50 is a caster (not numbered) so that the anechoic chamber 100 may be readily moved. The inside of each one of the walls 43, 44, 45, 46, 47, 48, of the enclosure 50 (as shown in FIG. 2) is lined with an absorptive material 52 for absorbing radio frequency (R.F.) energy. A front access hole 58 is formed through the front wall 43 for access to the inside of enclosure 50. An opening 40 (also included in a region sometimes referred to as "quiet zone 40 qz") is formed through the front wall 43 above the front access hole 58. Surrounding the opening 40 is a test antenna mounting surface 42 for mounting a test antenna (not shown). The quiet zone 40qz is an area exposed to R.F. energy having a wavefront of approximately uniform amplitude and phase distribution which will appear as R.F. energy having far-field characteristics to the test antenna (not shown) when mounted on the test antenna mounting surface 42. With the aperture of the test antenna located in the quiet zone 40 qz, the effect on the test antenna by R.F. energy having far-field characteristics can be measured. In the enclosure 50 the elements of the anechoic chamber 100 are shown to include an R.F. energy source 10, a reflector 20, a lens 30, a turntable 18, turntable control circuitry 60 and turntable control panel 62, each to be described in detail hereinafter.

Figure 3A:
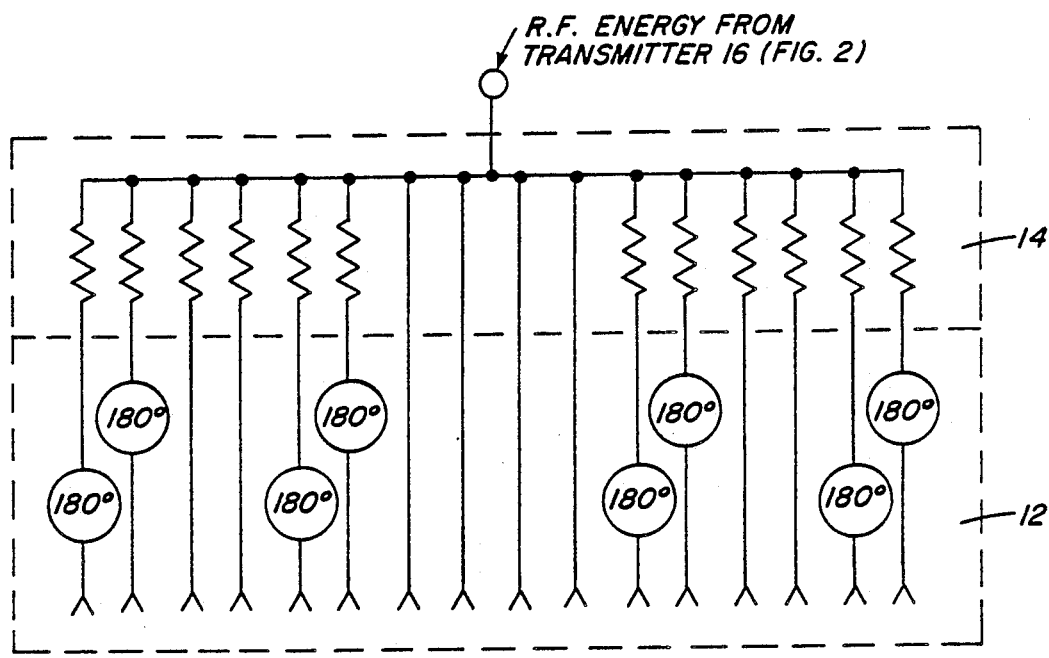
FIG. 3A is a schematic diagram of a corporate feed and a source antenna.
Figure 3B:
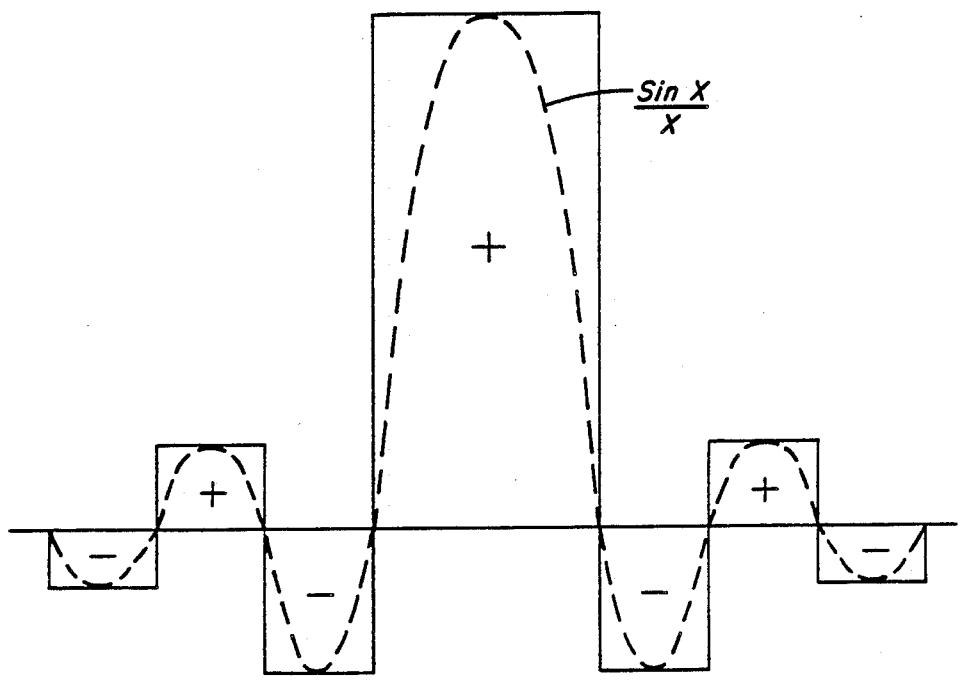
FIG. 3B is a graphic representation of the R.F. energy having the wavefront with an amplitude having a distribution pattern that approximates (SIN X)/X produced by the corporate feed and source antenna shown in FIG. 3A.

Referring now to FIG. 2, the R.F. energy source 10 is shown to comprise a source antenna 12, here an array of antenna elements (not shown), fed by a corporate feed 14 (illustrated in FIG. 3A), to form a beam (as illustrated in FIG. 3B of radio frequency (R.F.) energy from a transmitter 16. R.F. energy source 10 is capable of producing R.F. energy having a wavefront with an amplitude having a distribution pattern that approximates (SIN X)/X. Since, as described hereinafter, it may be necessary to adjust the polarization of the R.F. energy in the beam irradiating the aperture of the antenna under test (not shown), each antenna element of source antenna 12 should be a dual polarized element, user selectable, thereby allowing the user to select the polarization transmitted. The source antenna 12 here is a conventional two-dimensional array, here an array of 16×16 antenna elements using crossed-dipole elements. The aperture of the source antenna 12 is tilted so that the boresight line of the beam from such antenna is directed upwardly. The degree of tilt is such that the boresight line of the beam, after reflection from the reflector 20, is directed to the center of the lens 30.

Referring to FIG. 3A (a schematic representation of the corporate feed 14 and source antenna 12) which is shown to include: (a) resistors to control the amount of R.F. energy applied to individual antenna elements of the source antenna 12; and (b) 180° phase shifters at selected ones of the antenna elements. As a result, then, the beam of R.F. energy from the antenna 12 has a pattern that approximates a (SIN X)/X pattern (FIG. 3B).

Referring again to FIG. 2, R.F. energy source 10 is mounted on a turntable 18 in any convenient manner to rotate with turntable 18 under the control of turntable control circuitry 60 (FIG. 1). Turntable 18 is supported on a rotatable shaft 55, which is journaled in a bearing (not shown) within a turntable base 54. A motor (not shown) is positioned in the base 54 and coupled to the shaft 55 for rotating the turntable 18. Orientation of the turntable 18 is controlled by turntable control circuit 60 (FIG. 1) as selected by an operator (not shown) using turntable control panel 62 (FIG. 1) or by a computer (not shown) through a computer interface port (not shown). The source antenna 12 is mounted on the turntable 18 so that the center of the source antenna 12 is located directly above the center of the turntable 18 (i.e., at a point on the axis of rotation of the turntable 18). Corporate feed 14 is mounted on turntable 18 so that corporate feed 14 does not interfere with the R.F. energy radiating from source antenna 12. Transmitter 16 is also mounted on turntable 18 so that the transmitter 16 does not interfere with the R.F. energy radiating from source antenna 12.

The reflector 20, having a concave reflecting surface corresponding to a portion of a right cylinder, the longitudinal axis of which corresponds with the axis of rotation of the turntable 18, is mounted, as shown, by any known means within enclosure 50 so that such reflecting surface extends from the right wall 45 to the left wall 46 and from the top wall 47 to the bottom wall 48. It follows, then, that the center of source antenna 12 is on the focal line of the reflector 20 even when the turntable 18 is rotated. Consequently, even though different areas on the reflector 20 are irradiated when the turntable 18 is rotated, the boresight line of the beam reflected from the reflector 20 is always pointed toward the center of the opening 40.

A lens 30 (here a plano-convex dielectric lens) is mounted, as shown, on a post 34 affixed to the turntable 18 so that as the turntable 18 is rotated, the position of lens 30 relative to R.F. energy source 10 remains constant. Lens 30 (here having a diameter of 16 inches) is large enough so that substantially all of the R.F. energy in the beam from the R.F. energy source 10 will pass, after reflection from the reflector 20, through the lens 30. Lens 30 is positioned with the flat side of the lens facing the opening 40 and the curved side facing the reflector 20. Lens 30, here fabricated from a material having a dielectric constant of approximately 2, is shaped so that a focal point of the curved side of such lens is coincident with the center of the aperture of the source antenna 12, i.e., the origin of the beam. The relationship of the diameter (D), dielectric constant (N) and focal length (F) of lens 30 is variable as long as the lens formula for a plano-convex lens is followed and D is much less than F. Lens 30 corrects phase deviation of the wavefront of the R.F. energy radiated from R.F. energy source 10 without introducing any appreciable spherical aberration, thereby providing a wavefront having negligible phase distortion as the wavefront irradiates the opening 40.

R.F. energy that does not propagate through the lens 30 will be absorbed by the absorptive material 52, as will other stray R.F. energy in the anechoic chamber 100.

It should now be obvious to one of skill in the art that the beam out of the lens 30 will be collimated for some distance, starting at the plane surface of the lens 30 and extending beyond the opening 40. That is to say, in such distance the R.F. energy in the beam exhibits far-field characteristics. So long as the opening 40 is within the "collimated distance," then the beam will appear to a test antenna (not shown) mounted on the test mounting surface 42 around the opening 40 to be from a distant source, even though the angle of approach of the beam may change with rotation of the turntable 18.

It will now be appreciated that, in operation, the just-described anechoic chamber 100 (FIG. 1) is equivalent to a full scale antenna range wherein a test antenna in the far field of an R.F. source is rotated to change the angle of incidence of substantially collimated R.F. energy on the aperture of the test antenna.

It should be obvious to one of skill in the art that antennas of different size can be tested by mounting the test antenna on a plate (not shown) and mounting the plate to the test antenna mounting surface 42, thereby accommodating antennas that cannot be mounted directly to antenna mounting surface 42. By first positioning the test antenna in a normal orientation and performing a test, the radiation pattern of the test antenna for changes in azimuth can be measured. Then, turning the test antenna ninety degrees and performing a second test, the radiation pattern of the test antenna for changes in elevation can be measured. Further, turning the test antenna through different angles may be effected to allow a three-dimensional radiation pattern of the test antenna to be measured to any desired degree of accuracy. As described hereinbefore, source antenna 12 is capable of changing polarization so that the test antenna can experience the same polarization however the test antenna is oriented. When the anechoic chamber 100 is in use, the front access hole 58 (FIG. 1) is covered by front access hole cover 56. Cover 56 is a metal plate lined with an absorptive material for absorbing R.F. energy, thereby preventing R.F. energy from escaping through the front access hole 58 (FIG. 1). It should also be appreciated that the size of the anechoic chamber 100 can be changed as long as the above-described relationships exist; thus, the dimensions of the disclosed design are scalable.

Having described this invention, it will now be apparent to one of skill in the art that the size and disposition of various elements may be changed without affecting this invention. For example, transmitter 16 could be located off of the turntable 18 and coupled to the corporate feed 14 by means of a waveguide rotating joint (no shown) which is positioned within the shaft 55 of the turntable 18. The waveguide rotating joint enables the source antenna 12 and the corporate feed 14 to rotate with the turntable 18 while the transmitter 16 is in a fixed position. Also, the test antenna (not shown) could be mounted on a gimbal on the plate (not shown) to change the boresight of the test antenna so that changes in elevation could be measured instead of turning the test antenna 90°. Further, the shape of the miniature anechoic chamber could be changed. It is felt, therefore, that this invention should not be restricted to its disclosed embodiment, but rather should be limited only by the spirit and scope of the appended claims.

What is claimed is:

1. An anechoic chamber for testing an antenna by producing a radiation pattern in a predetermined plane at an aperture of the antenna comprising:
   (a) first means for supporting the antenna under test around an opening formed in the anechoic chamber to expose the aperture of such antenna to a beam of radio frequency energy generated within such chamber;
   (b) second means, disposed within the anechoic chamber at a position removed from the opening, for generating a beam of radio frequency energy having an origin within the anechoic chamber, a main lobe of such beam having a shape corresponding in amplitude to the shape of a beam with substantially a (SIN X)/X distribution;
   (c) third means disposed within the anechoic chamber at a position adjacent the opening, such third means being in a path of at least the main lobe of the beam of radio frequency energy, for collimating the radio frequency energy in at least the main lobe of the beam of radio frequency energy within the anechoic chamber, to produce a substantially collimated beam of radio frequency energy irradiating the aperture of the antenna under test; and
   (d) fourth means, disposed within the anechoic chamber, for simultaneously moving the second and third means to change a direction of approach of the substantially collimated beam of radio frequency energy fed to the aperture of the antenna under test.

2. The anechoic chamber as recited in claim 1 wherein the first means for supporting an antenna under test comprises:
   (a) an antenna mounting arrangement adapted for mounting the antenna under test at different positions relative to the opening so that radiation patterns at different predetermined planes at the aperture of the antenna under test may e determined; and
   (b) means for adjusting the polarization of the R.F. energy in the beam irradiating the aperture of the antenna under test.

3. The anechoic chamber as recited in claim 2 wherein the second means comprises:
   (a) a transmitter having an output for producing R.F. energy;
   (b) an array of antenna elements, each one of such elements having an input; and
   (c) a corporate feed, having resistors and phase shifters, for controlling the phase and amount of R.F. energy from the output of the transmitter to the input of each one of the antenna elements.

4. The anechoic chamber as recited in claim 3 wherein the third means comprises a lens having at least one focal point, such lens being disposed within the anechoic chamber in the path of the beam, the at least one focal point of such lens being coincident with the origin of the beam.

5. The anechoic chamber as recited in claim 4 wherein the fourth means comprises
   a turntable on which the second and third means are mounted, an axis of rotation of the turntable intersecting the at least one focal point of the lens and the origin of the beam; and the anechoic chamber further comprising
   a concave reflector having a reflecting surface corresponding to a surface of a right cylinder with a longitudinal axis collinear with the axis of rotation of the turntable.

6. The anechoic chamber as recited in claim 3 wherein each one of the antenna elements comprises a dual-polarized element.

* * * * *